(12) United States Patent
Cheng et al.

(10) Patent No.: US 11,335,873 B2
(45) Date of Patent: May 17, 2022

(54) QUANTUM DOT SOLID-STATE FILM AND METHOD FOR PREPARING SAME, AND QUANTUM DOT LIGHT-EMITTING DIODE

(71) Applicant: TCL TECHNOLOGY GROUP CORPORATION, Huizhou (CN)

(72) Inventors: Luling Cheng, Huizhou (CN); Yixing Yang, Huizhou (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 0 days.

(21) Appl. No.: 16/493,606

(22) PCT Filed: Mar. 13, 2018

(86) PCT No.: PCT/CN2018/078777
§ 371 (c)(1),
(2) Date: Sep. 12, 2019

(87) PCT Pub. No.: WO2018/166428
PCT Pub. Date: Sep. 20, 2018

(65) Prior Publication Data
US 2020/0106036 A1  Apr. 2, 2020

(30) Foreign Application Priority Data
Mar. 15, 2017 (CN) .......................... 201710154738.7

(51) Int. Cl.
*H01L 51/50* (2006.01)
*H01L 51/00* (2006.01)
(Continued)

(52) U.S. Cl.
CPC ........ *H01L 51/502* (2013.01); *H01L 51/0003* (2013.01); *H01L 51/5056* (2013.01);
(Continued)

(58) Field of Classification Search
CPC ............... H01L 51/502; H01L 51/5056; H01L 51/5072; H01L 51/5221
See application file for complete search history.

(56) References Cited

U.S. PATENT DOCUMENTS

2007/0032091 A1* 2/2007 Heald ............... H01L 21/28229
438/758
2007/0194694 A1* 8/2007 Reddy .................. C09K 11/883
313/503
(Continued)

FOREIGN PATENT DOCUMENTS

CN   101405888 A    4/2009
CN   102112901 A  * 6/2011  ............. H01S 5/341
(Continued)

OTHER PUBLICATIONS

KR-20100015869-A machine translation (Year: 2021).*
(Continued)

*Primary Examiner* — Vincent Wall
(74) *Attorney, Agent, or Firm* — Anova Law Group, PLLC

(57) ABSTRACT

Disclosed are quantum dot solid-state film, method for preparing same, and quantum dot light-emitting diode. Method comprises: providing quantum dot solution, preparing quantum dot material solid-state film on substrate; before being immersed in surface modifier solution to obtain quantum dot material solid-state film modified by a surface modifier; providing a metal nanoparticle seed solution, using solution method to deposit nanoparticle on quantum dot material solid-state film modified by surface modifier to obtain a quantum dot material solid-state film with the surface having adsorbed a layer of metal nanoparticle seed; before being immersed in a metal nano wire precursor solution, nanoparticle to perform a metal nano wire growth, finally obtaining a quantum dot solid-state film. The quan-
(Continued)

tum dot solid-state film obtained using method of invention can effectively and rapidly transmit electrical charges, improving overall performance of device.

8 Claims, 2 Drawing Sheets

(51) Int. Cl.
*H01L 51/52* (2006.01)
*H01L 51/56* (2006.01)
*B82Y 30/00* (2011.01)
*B82Y 40/00* (2011.01)

(52) U.S. Cl.
CPC ...... *H01L 51/5072* (2013.01); *H01L 51/5221* (2013.01); *H01L 51/56* (2013.01); *B82Y 30/00* (2013.01); *B82Y 40/00* (2013.01)

(56) References Cited

U.S. PATENT DOCUMENTS

| | | | | |
|---|---|---|---|---|
| 2007/0257609 A1* | 11/2007 | Fukuda | ............... | H01L 51/5284 313/506 |
| 2007/0275230 A1* | 11/2007 | Murphy | .................. | C23C 26/00 428/323 |
| 2009/0267049 A1* | 10/2009 | Cho | ........................ | H01L 33/18 257/13 |
| 2016/0027963 A1* | 1/2016 | Jun | ...................... | G02B 5/3025 257/13 |

FOREIGN PATENT DOCUMENTS

| | | | | |
|---|---|---|---|---|
| CN | 104157671 A | 11/2014 | | |
| CN | 105140358 A | 12/2015 | | |
| CN | 105140412 A | 12/2015 | | |
| DE | 112008003958 T5 * | 7/2011 | ............. | B82Y 20/00 |
| KR | 20100015869 A * | 2/2010 | ......... | H01L 31/1025 |
| WO | 2009009612 A9 | 7/2009 | | |

OTHER PUBLICATIONS

CN-102112901-A machine translation (Year: 2021).*
DE-112008003958-T5 machine translation (Year: 2021).*
The World Intellectual Property Organization (WIPO) International Search Report for PCT/CN2018/078777, dated May 9, 2018 5 Pages.

* cited by examiner

| Cathode |
| Electron transport layer |
| Quantum dot solid-state film |
| Hole transport layer |
| Hole injection layer |
| Anode |

…

QUANTUM DOT SOLID-STATE FILM AND METHOD FOR PREPARING SAME, AND QUANTUM DOT LIGHT-EMITTING DIODE

CROSS-REFERENCES TO RELATED APPLICATIONS

This application is a national stage application of PCT Patent Application No. PCT/CN2018/078777, filed on 13 Mar. 2018, which claims priority to Chinese Patent Application No. 201710154738.7, filed on 15 Mar. 2017, the content of all of which is incorporated herein by reference.

TECHNICAL FIELD

The present disclosure relates to the field of light emitting diode, and, more particularly, to a quantum dot solid-state film and a method for preparing same, and a quantum dot light-emitting diode.

BACKGROUND

A quantum dot (QD) is a relatively hot field in this century, especially for a light emitting quantum dot, due to a plurality of characters including an adjustable band gap, a good color purity, and a good stability thereof.

At present, an application field of the quantum dot is also relatively wide, especially for a quantum dot light-emitting diode, and a quantum dot display is expected to become a next generation of new display technology. However, in a current technology of a quantum dot light-emitting diode display, preparing a quantum dot film and assembling a plurality of quantum dot devices are very important. In a quantum dot light-emitting diode, a problem of balancing a charge when being injected may be involved, and an imbalance of injecting a plurality of electrons and holes may affect a luminous efficiency and a lifetime of an entire device. When adjusting an electron injection balance of a quantum dot solid-state film, it is generally adopting a method of adjusting an energy level barrier of an electron transport layer and a change of a ligand length on a surface of the quantum dot. However, none of these may effectively and quickly transmit a charge.

Therefore, the current technology needs to be improved and developed.

BRIEF SUMMARY OF THE DISCLOSURE

According to the above described defects, the purpose of the present disclosure is providing a quantum dot solid-state film and a method for preparing same, and a quantum dot light-emitting diode, in order to solve a problem in the current technology that the quantum dot solid-state film is not able to transfer a charge effectively and quickly.

A technical solution of the present disclosure to solve the technical problems is as follows:

A method for preparing a quantum dot solid-state film, wherein comprising:

providing a quantum dot solution, and preparing a quantum dot material solid-state film on a substrate;

immersing the quantum dot material solid-state film in a surface modifier solution, and obtaining a quantum dot material solid-state film modified by a surface modifier;

providing a metal nanoparticle seed solution, and using a solution method to deposit the metal nanoparticle seed solution on the quantum dot material solid-state film modified by the surface modifier to obtain a quantum dot material solid-state film with the surface having adsorbed a layer of metal nanoparticle seed;

providing a metal nanowire precursor solution, immersing the quantum dot material solid-state film having adsorbed a layer of metal nanoparticle seed in the metal nanowire precursor solution to perform a metal nanowire growth, before obtaining the quantum dot solid-state film.

The method for preparing the quantum dot solid-state film, wherein comprising:

formulating a plurality of quantum dots into a quantum dot solution, depositing the quantum dot solution on a substrate before drying, and forming the quantum dot material solid-state film;

formulating a surface modifier into a surface modifier solution, immersing the quantum dot material solid-state film prepared in the surface modifier solution, followed by drying and washing, before obtaining a quantum dot material solid-state film modified by the surface modifier;

formulating a metal nanoparticle seed into a metal nanoparticle seed solution, then using the solution method to deposit the metal nanoparticle seed solution on the quantum dot material solid-state film modified by the surface modifier, before drying, and obtaining a quantum dot material solid-state film with the surface having adsorbed a layer of metal nanoparticle seed;

immersing the quantum dot material solid-state film with the surface having adsorbed a layer of metal nanoparticle seed in a metal nanowire precursor, to grow a plurality of metal nanowires, before obtaining the quantum dot solid-state film.

The method for preparing the quantum dot solid-state film, wherein the quantum dot in the quantum dot solution is at least one of a binary phase quantum dot, a ternary phase quantum dot, and a quaternary phase quantum dot.

The method for preparing the quantum dot solid-state film, wherein the binary phase quantum dot is at least one of a CdS, a CdSe, a CdTe, an InP, an AgS, a PbS, a PbSe, and an HgS; the ternary phase quantum dot is at least one of a $Zn_xCd_{1-x}S$, a $Cu_xIn_{1-x}S$, a $Zn_xCd_{1-x}Se$, a $Zn_xSe_{1-x}S$, a $Zn_xCd_{1-x}Te$, and a $PbSe_xS_{1-x}$; the quaternary phase quantum dot is at least one of a $Zn_xCd_{1-x}$ S/ZnSe, a $Cu_xIn_{1-x}S$/ZnS, a $Zn_xCd_{1-x}Se$/ZnS, a CuInSeS, a $Zn_xCd_{1-x}Te$/ZnS, and a $PbSe_xS_{1-x}$/ZnS.

The method for preparing the quantum dot solid-state film, wherein the surface modifier is at least one of a (3-aminoethyl) triethoxysilane, a (3-aminopropyl) triethoxysilane, a (3-aminobutyl) triethoxysilane, a (3-aminoethyl) tripropoxy silane, a (3-aminopropyl) tripropoxysilane, a (3-aminobutyl) tripropoxysilane, a (3-aminoethyl) tributoxysilane, a (3-aminopropyl) tributyloxysilane, and a (3-aminobutyl) tributoxysilane.

The method for preparing the quantum dot solid-state film, wherein the metal nanoparticle seed is at least one of an Au nanoparticle, an Ag nanoparticle, and a Cu nanoparticle.

The method for preparing the quantum dot solid-state film, wherein the metal nanowire precursor solution is one of an Au nanowire precursor solution, an Ag nanowire precursor solution, and a Cu nanowire precursor solution.

The method for preparing the quantum dot solid-state film, wherein the Au nanowire precursor solution comprises an $H_2O$, a $CH_3OH$, an $HAuCl_4$, a vitamin C and an MBA (4-mercaptonbenzoic acid); the Ag nanowire precursor solution comprises an $H_2O$, an MEG (mono polyethylene glycol), an $AgNO_3$ and a PVP (polyvinyl pyrrolidone); the Cu nanowire precursor solution comprises an NaOH, a CuNO$_3$, an ethylenediamine and a hydrazine hydrate.

A quantum dot solid-state film, wherein the quantum dot solid-state film comprises a quantum dot material solid-state film, the quantum dot material solid-state film has a layer of metal nanowires grown on a surface.

A quantum dot light emitting diode, wherein the quantum dot light emitting diode comprises a cathode and an anode, and between the cathode and the anode, the quantum dot solid-state film according to the present disclosure is deposited.

The quantum dot light emitting diode, wherein comprising an anode, a hole injection layer, a hole transport layer, a quantum dot solid-state film, an electron transport layer and a cathode combined in a laminated sequence.

Benefits: The present disclosure first prepares a quantum dot into a quantum dot material solid-state film, and uses a surface modifier to modify the quantum dot material solid-state film, then deposits the metal nanoparticle seeds on the modified quantum dot material solid-state film, and finally immerses the quantum dot material solid-state film having adsorbed a layer of metal nanoparticle seeds in a metal nanowire precursor solution, to perform a metal nanowire growth, so as to finally obtain a quantum dot material solid-state film having a layer of metal nanowires grown, that is, the quantum dot solid-state film is obtained. A QLED device may be further fabricated by using the present quantum dot solid film. The quantum dot material solid-state film having a layer of metal nanowires grown obtained by using the present method may be able to transmit a charge fast and efficiently, while also may improve an overall performance of a device.

DETAILED DESCRIPTION OF EMBODIMENTS

The present disclosure provides a quantum dot solid-state film and a method for preparing same, and a quantum dot light-emitting diode, in order to make the purpose, technical solution and the advantages of the present disclosure clearer and more explicit, further detailed descriptions of the present disclosure are stated here, referencing to the attached drawings and some preferred embodiments of the present disclosure. It should be understood that the detailed embodiments of the disclosure described here are used to explain the present disclosure only, instead of limiting the present disclosure.

Figure 1:
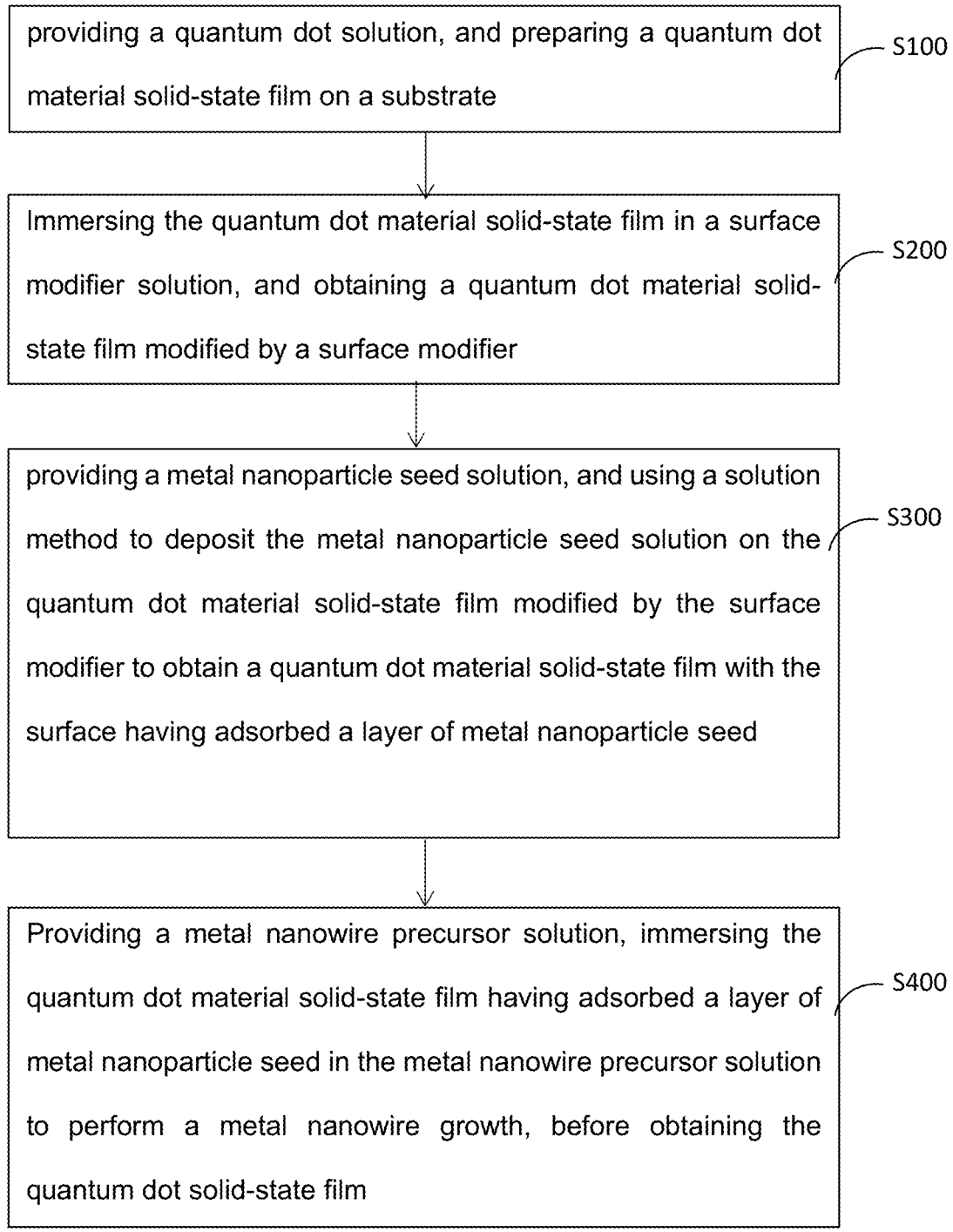
FIG. 1 illustrates a flowchart of a preferred embodiment on the method for preparing a quantum dot solid-state film as provided in the present disclosure.

FIG. 1 illustrates a flowchart of a preferred embodiment on the method for preparing a quantum dot solid-state film as provided in the present disclosure, shown as the figure, it comprises:

Step S100, providing a quantum dot solution, and preparing a quantum dot material solid-state film on a substrate;

The step S100 is, specifically, drying and weighting a plurality of quantum dots, before dissolving in a solvent, such as a toluene or a chloroform, to formulate a quantum dot solution, wherein a concentration of the quantum dot solution is 1 to 50 mg/mL, and a preferred concentration is 15 mg/mL. Then by a solution method, depositing the quantum dot solution prepared on a substrate (such as a piece of ITO glass), before drying and preparing a quantum dot material solid film. The solution method described in the present embodiment may be, but not limited to, at least one of a spin coating method, an immersion pulling method, a printing method, an inkjet printing method, a spray coating method, a roll coating method, a knife coating method, a casting method, an electrolytic deposition method, a slitting coating method, and a strip coating method.

Preferably, the quantum dot in the quantum dot solution is at least one of a binary phase quantum dot, a ternary phase quantum dot, a quaternary phase quantum dot and more. Wherein, the binary phase quantum dot may be at least one of a CdS, a CdSe, a CdTe, an InP, an AgS, a PbS, a PbSe, an HgS and more; the ternary phase quantum dot may be at least one of a $Zn_XCd_{1-X}S$, a $Cu_XIn_{1-X}S$, a $Zn_XCd_{1-X}Se$, a $Zn_XSe_{1-X}S$, a $Zn_XCd_{1-X}Te$, a $PbSe_XS_{1-X}$ and more; the quaternary phase quantum dot may be at least one of a $Zn_XCd_{1-X}S/ZnSe$, a $Cu_XIn_{1-X}S/ZnS$, a $Zn_XCd_{1-X}Se/ZnS$, a CuInSeS, a $Zn_XCd_{1-X}Te/ZnS$, a $PbSe_XS_{1-X}/ZnS$ and more.

S200. Immersing the quantum dot material solid-state film in a surface modifier solution, and obtaining a quantum dot material solid-state film modified by a surface modifier;

The step S200 is, specifically, dissolving a surface modifier into a solvent, such as a methanol or else, stirring to equal at a room temperature, before obtaining a surface modifier solution. After immersing the quantum dot material solid-state film prepared in the surface modifier solution for a certain period of time, preferably, the immersion time is 1-3 min, such as 2 min, the quantum dot solid-state film is then taken out and dried out by using a centrifuge at 1000 rpm for 10 s, before washed with methanol twice at 2000 rpm for 20 s, a quantum dot solid-state film modified by the surface modifier is then obtained.

Preferably, the surface modifier may be at least one of a (3-aminoethyl) triethoxysilane, a (3-aminopropyl) triethoxysilane, a (3-aminobutyl) triethoxysilane, a (3-aminoethyl) tripropoxysilane, a (3-aminopropyl) tripropoxysilane, a (3-aminobutyl) tripropoxysilane, a (3-aminoethyl) tributoxysilane, a (3-aminopropyl) tributyloxysilane, a (3-aminobutyl) tributoxysilane. More preferably, the surface modifier is the (3-aminopropyl) triethoxysilane (APTES).

Step S300, providing a metal nanoparticle seed solution, and using a solution method to deposit the metal nanoparticle seed solution on the quantum dot material solid-state film modified by the surface modifier, a quantum dot material solid-state film with the surface having adsorbed a layer of metal nanoparticle seed is then obtained.

The step S300 is, specifically, formulating a metal nanoparticle seed into a metal nanoparticle seed solution, then using the solution method to deposit the metal nanoparticle seed solution on the quantum dot material solid-state film modified by the surface modifier, before drying, and obtaining a quantum dot material solid-state film with the surface having adsorbed a layer of metal nanoparticle seed. The solution method described in the present embodiment may be, but not limited to, at least one of a spin coating method, an immersion pulling method, a printing method, an inkjet printing method, a spray coating method, a roll coating method, a knife coating method, a casting method, an electrolytic deposition method, a slitting coating method, and a strip coating method.

In the step S300, the metal nanoparticle seed is at least one of an Au nanoparticle, an Ag nanoparticle, and a Cu nanoparticle. Preferably, the metal nanoparticle seed is the Au nanoparticle.

Step S400, providing a metal nanowire precursor solution, immersing the quantum dot material solid-state film having adsorbed a layer of metal nanoparticle seed in the metal nanowire precursor solution to perform a metal nanowire growth, and the quantum dot solid-state film is obtained.

The step S400 is, specifically, the quantum dot material solid-state film having adsorbed a layer of metal nanoparticle seeds is immersed in the precursor solution containing the metal nanowire, a mixture is protected by an inert gas and under a continuous stirring state, before growing the metal nanowires, with a growth time of 15~25 minutes (such as 20 min), a quantum dot material solid-state film having a layer of metal nanowires is obtained, that is, the quantum dot solid-state film is then obtained.

Preferably, the metal nanowire precursor solution may be one of an Au nanowire precursor solution, an Ag nanowire precursor solution, a Cu nanowire precursor solution. Wherein, the Au nanowire precursor solution comprises an ions-free water ($H_2O$), a methanol ($CH_3OH$), an $HAuCl_4$, a vitamin C and an 4-Mercaptobenzoic acid (MBA); the Ag nanowire precursor solution comprises an ions-free water ($H_2O$), a mono ethylene glycol (MEG), an $AgNO_3$ and a polyvinyl pyrrolidone (PVP); the Cu nanowire precursor solution comprises an NaOH, a $CuNO_3$, an ethylenediamine and a hydrazine hydrate.

The present embodiment further provides a quantum dot solid-state film, wherein the quantum dot solid-state film comprises the quantum dot material solid-state film, the quantum dot material solid-state film has a layer of metal nanowires grown on a surface. The quantum dot material solid-state film having a layer of metal nanowires grown on a surface may be able to transfer an electric charge fast and effectively, and improve an overall performance of a device.

The present embodiment further provides a quantum dot light emitting diode, wherein the quantum dot light emitting diode comprises a cathode and an anode, and between the cathode and the anode, the quantum dot solid-state film according to the present embodiment is deposited.

Figures 2, 3:
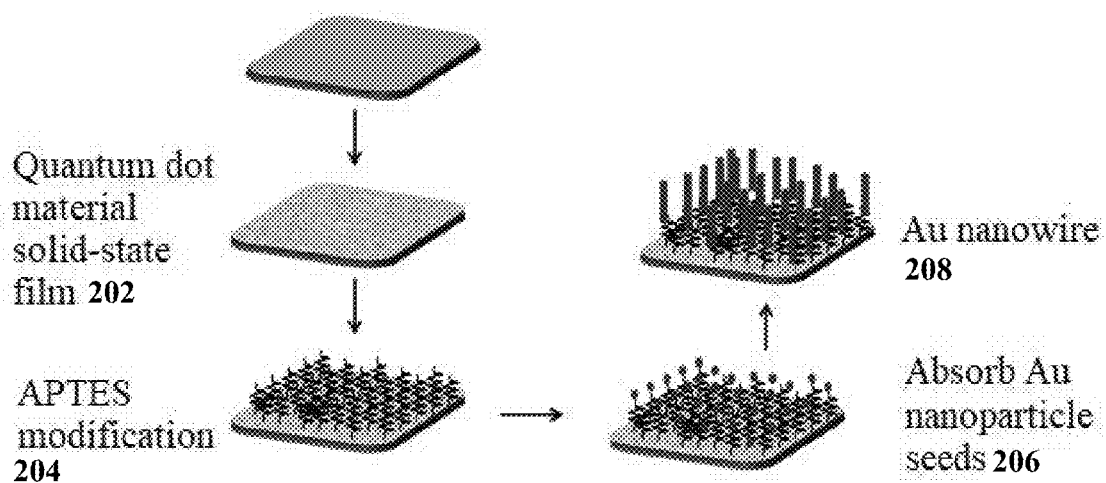
FIG. 2 illustrates a schematic diagram on a process of preparing a quantum dot solid-state film according to an embodiment in the present disclosure.
FIG. 3 illustrates a schematic diagram of a quantum dot light emitting diode according to an embodiment in the present disclosure.

Specifically, as shown in FIG. 3, the quantum dot light emitting diode comprises an anode, a hole injection layer, a hole transport layer, a quantum dot solid-state film described above, an electron transport layer and a cathode combined in a laminated sequence. During a preparation process of a QLED device, adopting the quantum dot solid-state film described above in the present embodiment as a quantum dot light emitting layer, may be able to improve the overall performance of the device.

Preferably, the anode may be selected from at least one of an indium doped tin oxide (ITO), a fluorine-doped tin oxide (FTO), an antimony-doped tin oxide (ATO), and an aluminum-doped zinc oxide (AZO).

Preferably, the hole injection layer in the present embodiment may be at least one of a poly(3,4-ethylenedioxythiophene)-polystyrenesulfonic acid (PEDOT:PSS), a copper phthalocyanine (CuPc), a 2,3,5,6-tetrafluorocarbon-7,7',8,8'-tetracyanoquinone-dimethane (F4-TCNQ), a 2,3,6,7,10,11-hexacyano-1,4,5,8,9,12-hexaazatriphenylene (HATCN), a doped or undoped transition metal oxide, and a doped or undoped metal sulfur-based compound; wherein the transition metal oxide may be, but not limited to, at least one of a $MoO_3$, a $VO_2$, a $WO_3$, a $CrO_3$, a CuO or a mixture thereof; the metal sulfur-based compound may be, but not limited to, a $MoS_2$, a $MoSe_2$, a $WS_2$, a $WSe_2$, a CuS or a mixture thereof.

Preferably, a material of the hole transport layer in the present embodiment may be selected from an organic material having a hole transmission ability, may be, but not limited to, at least one of a poly (9,9-dioctylfluorene-CO—N-(4-butylphenyl)diphenylamine) (TFB), a polyvinylcarbazole (PVK), a poly(N, N' bis(4-butylphenyl)-N, N'-bis(phenyl)benzidine) (poly-TPD), a poly(9,9-dioctylfluorene-co-bis-N,N-phenyl-1,4-phenylenediamine) (PFB), a 4,4',4"-tris(carbazol-9-yl)triphenylamine (TCTA), a 4,4'-bis(9-carbazole)biphenyl (CBP), an N,N'-diphenyl-N,N'-bis(3-methylphenyl)-1,1'-biphenyl-4,4'-diamine (TPD), an N, N'-Diphenyl-N,N'-(1-naphthyl)-1,1'-biphenyl-4,4'-diamine (NPB), a doped graphene, an undoped graphene, a C60 or a mixture thereof. The material of the hole transport layer may further be selected from an inorganic material having a hole transport ability, which may be at least one of an NiO, an $MoO_3$, a $VO_2$, a $WO_3$, a $CrO_3$, a CuO, an $MoS_2$, an $MoSe_2$, a $WS_2$, a $WSe_2$, a CuS or a mixture thereof.

Preferably, a material of the electron transport layer in the present embodiment may be at least one selected from, but not limited to, an n type of a ZnO, a $TiO_2$, an SnO, a $Ta_2O_3$, an AlZnO, an ZnSnO, an InSnO, an Alq3, a Ca, a Ba, a CsF, a LiF, and a $CsCO_3$; preferably, the electron transport layer is an n type of the ZnO or an n type of the $TiO_2$;

Preferably, the cathode in the present embodiment, may be at least one selected from, but not limited to, a plurality of conductive carbon materials, a plurality of conductive metal oxide materials, and a plurality of metal materials; wherein the conductive carbon materials may be, but not limited to, at least one of a plurality of doped or undoped carbon nanotubes, doped or undoped graphene, doped or undoped graphene oxide, C60, graphite, carbon fibers, porous carbon, or a mixture thereof; the conductive metal oxide material may be, but not limited to, at least one of ITO, FTO, ATO, AZO, or a mixture thereof; the metal material may be, but not limited to, at least one of Al, Ag, Cu, Mo, Au, or an alloy thereof; wherein for the metal material, a form thereof may be, but not limited to, at least one of a dense film, a nanowire, a nanosphere, a nanorod, a nanocone, a nano hollow sphere, or a mixture thereof; preferably, the cathode is Ag or Al.

Based on the quantum dot light emitting diode described above, the present embodiment further provides a preparation method for the quantum dot light emitting diode described above, comprising:

Step R. Preparing a hole injection layer on a anode containing a substrate;

Step S. Preparing a hole transport layer on the hole injection layer;

Step T. Preparing a quantum dot light emitting layer on the hole transport layer; the quantum dot light emitting layer is the quantum dot solid-state film described above;

Step U. Preparing an electron transport layer on the quantum dot light emitting layer, and vapor depositing a cathode on the electron transport layer, before achieving the quantum dot light emitting diode.

The quantum dot light emitting diode described in the present embodiment may be partially packed, fully packed, or unpacked.

A preparation method for each functional layer in the present embodiment may be a chemical method or a physical method, wherein the physical method may be, but not limited to, at least one of a spin coating method, a spray coating method, a roll coating method, a printing method, an inkjet method, a knife coating method, an immersion pulling method, an immersion method, a casting method, a slit coating method, a strip coating method, a heat evaporation coating method, an electron beam evaporation coating method, a magnetron sputtering method, a multi-arc ion plating method, a physical vapor deposition method, an atomic layer deposition method, and a pulse laser deposition method; the chemical method may be, but not limited to, at least one of a chemical vapor deposition method, a continuous ion layer adsorption and reaction method, an anodization method, an electrolytic deposition method, and a coprecipitation method.

It should be noted that, the present embodiment is not limited to the quantum dot light emitting diode having a structure described above, but may further comprise at least one of an interface functional layer or an interface modification layer, including but not limited to, at least one of an electron blocking layer, a hole blocking layer, an electrode modifying layer, and an isolation protective layer.

It should be noted that, the present embodiment is not limited to the quantum dot light emitting diode having a positive structure, but may further prepare a quantum dot light emitting diode having a negative structure. While the quantum dot light emitting diode having the negative structure may further comprise an interface functional layer or an interface modification layer, including but not limited to, at least one of an electron blocking layer, a hole blocking layer, an electrode modifying layer, and an isolation protective layer.

Combining with FIG. 2, a detailed description to the present embodiment is listed below, taking a precursor of a red oil-soluble quantum dot of CdSe/ZnS, APTES, Au nanoparticle, synthesis of Au nanowire as an example.

1. Steps of preparing the red oil-soluble quantum dot of CdSe/ZnS (i.e., a quantum dot material solid-state film 202) are as follows:
   1) Preparing a precursor of the Cadmium oleate (Cd$(OA)_2$) and a precursor of the Zinc oleate (Zn$(OA)_2$):
      Taking 0.8 mmol of Cadmium Oxide (CdO), 6 mmol of Zinc acetate (Zn$(Ac)_2$), 8 ml of oleic acid (OA), 15 ml of 1-octadecene (ODE), before adding into a three-necked flask, and exhausting for 10 min in a room temperature, followed by being heated to 170° C. and exhausting for 60 min, before being kept at 170° C.
   2) Preparing a precursor of Selenium (Se):
      Taking 4 mmol of Se, and adding into 4 ml of trioctylphophine oxide (TOP), heating to 170° C. and keeping for 30 min, before cooling to 140° C.
   3) Preparing a precursor of Sulfur (S):
      Taking 4 mmol of S, and adding into 6 ml of TOP, heating to 170° C. and keeping for 30 min, before cooling to 140° C.
   4) Rising a temperature of a mixture in the step 1) to 300° C., and taking 2 ml of the precursor of Se before injecting into the three-necked flask and reacting for 10 min, followed by taking 2 ml of S source and injecting into the reaction mixture and reacting for 30 min to obtain CdSe/ZnS red quantum dot, when the mixture solution cools to room temperature, performing centrifugal separation and washing before making a drying process to finally obtain the red oil-soluble quantum dot of CdSe/ZnS, which has a surface ligand of oleic acid (OA).

2. Preparing a red quantum dot material solid-state film of CdSe/ZnS modified by the APTES (i.e., APTES modification 204):
   1) Diluting the red oil-soluble quantum dot CdSe/ZnS prepared into a 15 mg/ml of CdSe/ZnS quantum dot solution, which is then spin-coated on a clean ITO glass plate at 3000 rpm for 30 s, followed by idling twice at 2000 rpm for 20 s to dry the quantum dot material solid-state film.
   2) Taking 3 mmol of APTES and dissolving into 10 ml of methanol (a methanol solution containing the APTES), stirring uniformly at a room temperature for 30 min, leaving for use.
   3) Immersing the quantum dot material solid-state film of CdSe/ZnS into the methanol solution containing the APTES for 2 min, then taking the quantum dot material solid-state film out, drying out by spinning at 1000 rpm for 10 s once, then washing twice at 2000 rpm for 20 s with 100 μl of anhydrous methanol.

3. Preparing a quantum dot material solid-state film containing the Au nanoparticles:

Preparing the Au nanoparticles: under an oil bath condition, adding 60 ml of water and 1 ml of 1% (wt %) hydrated HAu$Cl_4$·3$H_2O$ into a 100 ml three-necked flask, stirring thoroughly under an argon-protected condition. After 1 min, adding 1 ml of 1% (wt %) hydrated sodium citrate. After another 1 min, adding 1 ml of 0.075% (wt %) Na$BH_4$, and stirring a solution for 5 min before obtaining a plurality of gold nanoparticles, which is stored in dark at a low temperature (about 4° C.).

Preparing the Au nanoparticles prepared into a 10 mg/ml solution, before being spin-coated on the quantum dot material solid-state film modified by the APTES and prepared in the steps 2.3) described above, followed by spinning the film at a rotation speed of 5000 rpm, and obtaining only one layer of Au nanoparticles covering on the quantum dot material solid-state film.

Preparing a quantum dot material solid-state film having the Au nanowires growing:

Immersing the quantum dot material solid-state film containing only one layer of Au nanoparticle seeds 206 into a precursor solution containing the synthesized Au nanoparticles (60 ml of water, 1 ml of 1% HAu$Cl_4$·3$H_2O$, 1 ml of 1% hydrated sodium citrate, 1 ml of 0.075% Na$BH_4$), and the solution mixed is under an argon protection and a continuous stirring for 20 min, to grow the Au nanowires, and the quantum dot material solid-state film 208 having the Au nanowires growing is obtained, that is, obtaining the quantum dot solid-state film.

All above, the present disclosure provides a quantum dot solid-state film and a method for preparing same, and a quantum dot light-emitting diode. The present disclosure first prepares a quantum dot into a quantum dot material solid-state film, and uses a surface modifier to modify the quantum dot material solid-state film, then deposits the metal nanoparticles (such as the Au nanoparticles) on the modified quantum dot material solid-state film, and finally immerses the quantum dot material solid-state film having adsorbed a layer of metal nanoparticle seeds in a metal nanowire precursor solution, to perform a metal nanowire growth, so as to finally obtain a quantum dot material solid-state film having a layer of metal nanowires grown, that is, the quantum dot solid-state film is obtained. A QLED device may be further fabricated by using the present quantum dot solid film. The quantum dot material solid-state film having a layer of metal nanowires grown obtained by using the present method may be able to transmit a charge efficiently and fast, while also may improve an overall performance of a device.

It should be understood that, the application of the present disclosure is not limited to the above examples listed. Ordinary technical personnel in this field can improve or change the applications according to the above descriptions, all of these improvements and transforms should belong to the scope of protection in the appended claims of the present disclosure.

What is claimed is:

1. A quantum dot solid-state film, wherein the quantum dot solid-state film comprises a quantum dot material solid-state film, the quantum dot material solid-state film has a layer of metal nanowires grown on a surface, the layer of metal nanowires being grown in a direction perpendicular to the surface, wherein the quantum dot material solid-state film comprises a quantum dot and a surface modifier, and the surface modifier is at least one of a (3-aminoethyl) triethoxysilane, a (3-aminobutyl) triethoxysilane, a (3-aminoethyl) tripropoxysilane, a (3-aminopropyl) tripropoxysilane, a (3-aminobutyl) tripropoxysilane, a (3-aminoethyl) tributoxysilane, a (3-aminopropyl tributyloxysilane, and a (3-aminobutyl) tributoxysilane.

2. The quantum dot solid-state film according to claim 1, wherein the metal nanowire is one of an Au nanowire, an Ag nanowire, and a Cu nanowire.

3. A quantum dot light emitting diode, wherein the quantum dot light emitting diode comprises a cathode and an anode, and between the cathode and the anode, a quantum dot solid-state film is arranged, the quantum dot material solid-state film has a layer of metal nanowires grown on a surface, the layer of metal nanowires being grown in a direction perpendicular to the surface, wherein the quantum dot material solid-state film comprises a quantum dot and a surface modifier, and the surface modifier is at least one of a (3-aminoethyl) triethoxysilane, a (3-aminobutyl) triethoxysilane, a (3-aminoethyl) tripropoxysilane, a (3-aminopropyl) tripropoxysilane, a (3-aminobutyl) tripropoxysilane, a (3-aminoethyl) tributoxysilane, a (3-aminopropyl tributyloxysilane, and a (3-aminobutyl) tributoxysilane.

4. The quantum dot light emitting diode according to claim 3, further comprising an anode, a hole injection layer, a hole transport layer, a quantum dot solid-state film, an electron transport layer and a cathode combined in a laminated sequence.

5. The quantum dot light emitting diode according to claim 3, wherein the metal nanowire is one of an Au nanowire, an Ag nanowire, and a Cu nanowire.

6. The quantum dot solid-state film according to claim 1, wherein the quantum dot is a binary phase quantum dot.

7. The quantum dot solid-state film according to claim 1, wherein the quantum dot is a ternary phase quantum dot.

8. The quantum dot solid-state film according to claim 1, wherein the quantum dot is a quaternary phase quantum dot.

* * * * *